United States Patent
Wong et al.

(10) Patent No.: US 9,293,395 B2
(45) Date of Patent: Mar. 22, 2016

(54) LEAD FRAME WITH MOLD LOCK STRUCTURE

(71) Applicants: Wai Keong Wong, Shah Alam (MY); Soo Choong Chee, Shah Alam (MY); Stanley Job Doraisamy, Kuala Lumpur (MY)

(72) Inventors: Wai Keong Wong, Shah Alam (MY); Soo Choong Chee, Shah Alam (MY); Stanley Job Doraisamy, Kuala Lumpur (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 76 days.

(21) Appl. No.: 14/220,118

(22) Filed: Mar. 19, 2014

(65) Prior Publication Data

US 2015/0270195 A1 Sep. 24, 2015

(51) Int. Cl.
*H01L 23/495* (2006.01)
*H01L 23/31* (2006.01)
*H01L 23/00* (2006.01)

(52) U.S. Cl.
CPC .... *H01L 23/49503* (2013.01); *H01L 23/49541* (2013.01); *H01L 24/49* (2013.01); *H01L 23/3107* (2013.01); *H01L 23/49513* (2013.01); *H01L 23/49551* (2013.01); *H01L 2224/451* (2013.01); *H01L 2224/48091* (2013.01); *H01L 2224/48177* (2013.01); *H01L 2224/49171* (2013.01); *H01L 2924/00014* (2013.01); *H01L 2924/14* (2013.01); *H01L 2924/181* (2013.01)

(58) Field of Classification Search
CPC ............... H01L 21/48; H01L 21/4821; H01L 21/48247; H01L 21/49541; H01L 21/49548; H01L 23/32; H01L 23/48; H01L 23/52; H01L 2224/04; H01L 2224/06; H01L 2224/0605; H01L 2924/151; H01L 2924/1515; H01L 2924/15151
USPC .................................................. 257/666, 676
See application file for complete search history.

(56) References Cited

U.S. PATENT DOCUMENTS

| | | | |
|---|---|---|---|
| 5,424,576 A * | 6/1995 | Djennas et al. | 257/666 |
| 5,844,306 A | 12/1998 | Fujita | |
| 5,986,333 A | 11/1999 | Nakamura | |
| 6,744,119 B2 | 6/2004 | Kuo | |
| 6,965,157 B1 | 11/2005 | Perez | |
| 7,354,804 B2 * | 4/2008 | Kishimoto | 438/123 |
| 7,482,679 B2 * | 1/2009 | Aripin et al. | 257/666 |
| 7,808,089 B2 | 10/2010 | Nguyen | |
| 8,330,270 B1 | 12/2012 | Tsui | |
| 8,536,688 B2 | 9/2013 | Ahn | |
| 2001/0033011 A1 * | 10/2001 | Huang | 257/676 |
| 2015/0084169 A1 * | 3/2015 | Yow et al. | 257/670 |

FOREIGN PATENT DOCUMENTS

| | | | | |
|---|---|---|---|---|
| JP | 2001345413 A | * | 12/2001 | .............. H01L 23/50 |
| JP | 2008159742 A | * | 7/2008 | |
| JP | 2008196990 A | * | 8/2008 | |

* cited by examiner

*Primary Examiner* — Teresa M Arroyo
(74) *Attorney, Agent, or Firm* — Charles E. Bergere

(57) ABSTRACT

A lead frame for a semiconductor device includes a die paddle and leads situated on a perimeter of the lead frame. The die paddle has a metal frame and a number of substantially linear metal connecting bars within the frame. The connecting bars interconnect different locations of the frame to form a multiple triangles, where a triangular-shaped cavity is formed within each triangle. An overall area of the cavities is greater than an overall area of the connecting bars.

6 Claims, 5 Drawing Sheets

LEAD FRAME WITH MOLD LOCK STRUCTURE

BACKGROUND

The present invention relates generally to packaged semiconductor devices and, more particularly, to lead frames used in the assembly of semiconductor devices.

FIG. 1 is a top view of one type of conventional quad-flat no-leads (QFN) lead frame 100. The lead frame 100 is a patterned sheet metal cut-out that includes a rectangular-shaped die paddle 102 (also known as a flag) surrounded by a ground bar 104, and metal leads 106 surrounding the ground bar 104.

FIG. 2 is a top view of a partially assembled, conventional QFN device 200. The QFN device 200 is assembled by adhesively mounting an integrated circuit (IC) die 202 on the die paddle 102 of the lead frame 100. The IC die 202 is then electrically connected to the leads 106 with bond wires 204 and the ground bar 104 with bond wires 206.

Following wire bonding, the sub-assembly including the IC die 202, the lead frame 100, and the bond wires 204 and 206 is encapsulated in molding compound (not shown). The encapsulation step includes putting the sub-assembly inside a mold form having a cavity, injecting uncured molding compound into the cavity, curing the molding compound, and then removing the mold form. Note, however, that the bottom surfaces of the leads 106 are left exposed so that the leads 106 may provide electrical connections between device-internal components on the die 202 and external components such as power sources and input/output connections on a printed circuit board (PCB) on which the QFN package 200 is mounted.

Although not depicted in FIG. 2, typically multiple QFN devices 200 are simultaneously assembled using a one- or two-dimensional array of the lead frames 100. After encapsulation, singulation is performed to separate the simultaneously assembled QFN devices 200 into individual packages ready for mounting on PCBs.

It is well known that during operation of a semiconductor device such as the QFN device 200, the components of the package expand and contract with changes in temperature. Due to differences between the coefficient of thermal expansion (CTE) of the molding compound and the lead frame 100, the molding compound may expand and contract at a different rate than the lead frame 100. These differences in expansion and contraction rates can cause stress on the adhesive bond between the molding compound and the lead frame 100.

To further complicate the issue, the adhesive bond between the molding compound and the lead frame 100 may be weakened due to, for example, contaminants trapped between the molding compound and the lead frame 100, or inherent weakness of (e.g., silver) plating on the surface of the lead frame 100. When these possibly weakened adhesive bonds are subject to expansion and contraction stresses, delamination can occur, where the molding compound separates from the lead frame 100.

Delamination between the molding compound and the lead frame 100 may result in one or more of the bond wires 204 and 206 lifting away from the lead frame 100 such that the electrical connection between the bond wire and the lead frame 100 is lost. Further, delamination can lead to cracking of the molding compound when (i) moisture becomes trapped between the molding compound and the lead frame 100 at the location of the delamination and (ii) the moisture expands due to temperature changes. Accordingly, it would be advantageous to have a semiconductor device that is less susceptible to delamination problems.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In the following description, it will be understood that certain embodiments of the present invention are directed to configurations of die paddles used in lead frames. For ease of discussion, some of these die-paddle configurations are shown relative to their use in a particular type of lead frame (i.e., QFN) having a particular lead frame configuration (e.g., a particular number of leads having a particular shape). It will be understood that embodiments of the present invention are not limited to the particular lead frame types and lead frame configurations shown in the figures.

In one embodiment of the present invention, a lead frame for a packaged semiconductor device includes a die paddle and a plurality of metal leads. The die paddle comprises a metal frame and a plurality of substantially-linear, metal connecting bars within the frame. The connecting bars interconnect different locations of the frame to form a plurality of triangles, such that a triangular-shaped cavity is formed within each triangle. The leads are situated on a perimeter of the lead frame.

Figure 3A:
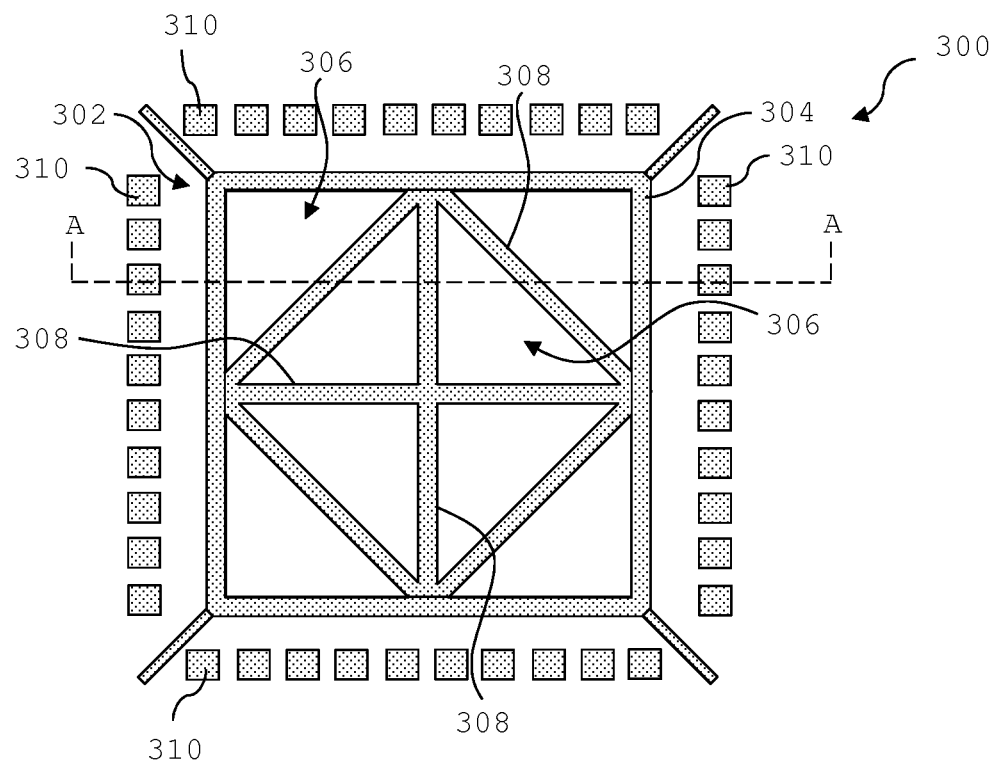
FIGS. 3A and 3B show a top view and a cross-sectional side view A-A, respectively, of a QFN lead frame according to one embodiment of the present invention.
Figure 3B:
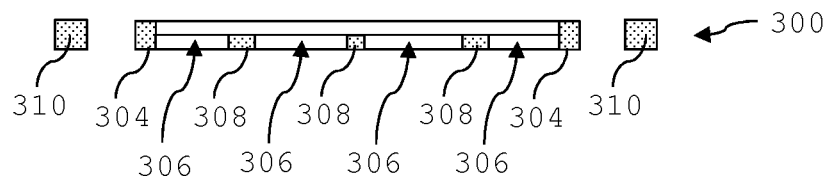

FIGS. 3A and 3B show a top view and a cross-sectional side view A-A, respectively, of a lead frame 300 according to one embodiment of the present invention. The lead frame 300 may be fabricated from a single sheet of a suitable conducting metal or alloy such as (without limitation) copper using, for example, etching and/or stamping. Although not shown, the lead frame 300 may be fabricated on a sheet with other lead frames and detached therefrom using saw singulation, etching, or stamping. The lead frame 300 thus comprises metal, however, as known by those of skill in the art, the lead frame may be plated or partially plated such as with silver.

The lead frame 300 comprises a die paddle 302 and leads 310 around the perimeter of the lead frame 300. Although not shown, the die paddle 302 and the leads 310 may be held together by metal tie bars that are later removed during the assembly of a semiconductor device.

The die paddle 302 has a substantially rectangular metal frame 304 and, in this embodiment, six substantially linear, metal connecting bars 308 within the metal frame 304. The metal connecting bars 308 interconnect different locations of the metal frame 304 to form a plurality of metal triangles (eight in this embodiment). Within each triangle, a triangular-shaped cavity 306 is formed entirely through the die paddle 302. The triangular-shaped cavities 306 may be formed by performing, for example, etching or stamping on the die paddle 302.

As shown in FIG. 3B, the thickness of the connecting bars 308 may be reduced using, for example, etching, such that the thickness of the connecting bars 308 is less than that of the frame 304 and the leads 310. The reduced thickness of the connecting bars 308 enables an integrated circuit (IC) die (not shown) to sit lower on the die paddle 304 when the IC die is mounted on and attached to the connecting bars 308. In the embodiment shown, the lead frame is configured for assembling a QFN type semiconductor device. However, as will be understood by those of skill in the art, the lead frame 300 configuration (i.e., the shape of the leads), may be changed so that other package type semiconductor devices may be assembled, such as a QFP (Quad Flat Pack).

Figure 4A:
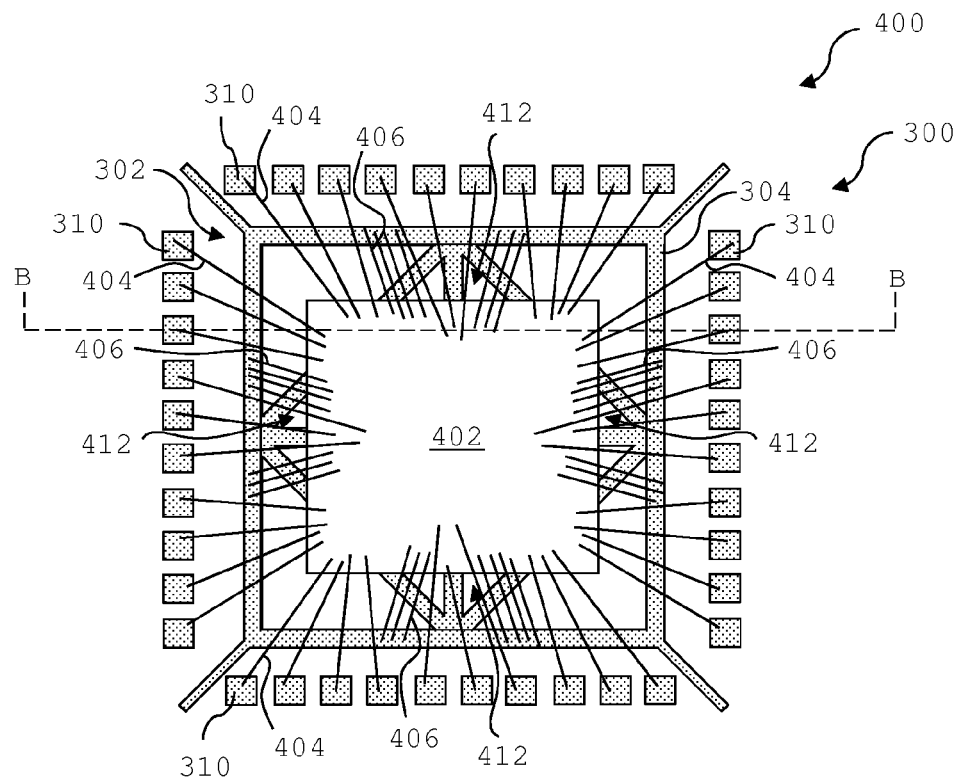
FIGS. 4A and 4B show a top view and a cross-sectional side view B-B, respectively, of a partially-assembled QFN semiconductor device according to one embodiment of the present invention.
Figure 4B:
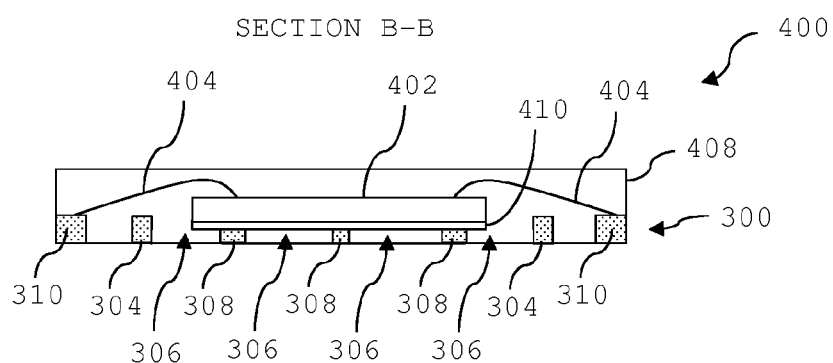

FIGS. 4A and 4B show a top view and a cross-sectional view B-B, respectively, of an assembled QFN semiconductor device 400 according to one embodiment of the present invention. The QFN semiconductor device 400 is assembled using the lead frame 300 in FIG. 3. To further understand the assembly of the QFN semiconductor device 400, consider FIG. 5.

Figure 5:
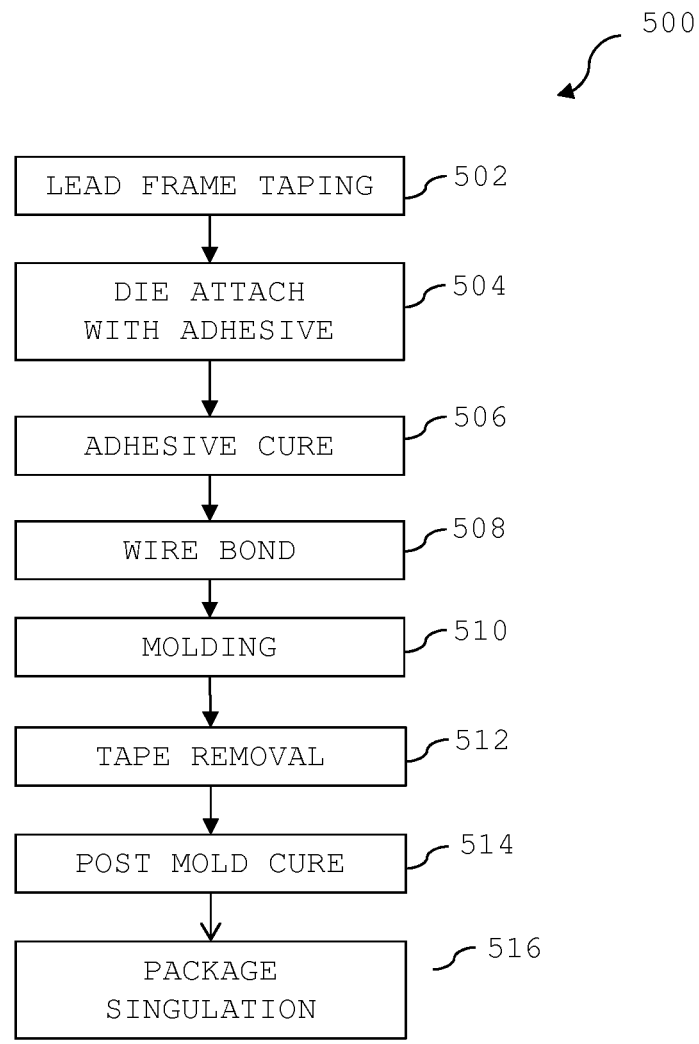
FIG. 5 is a simplified flow chart of a process for assembling the QFN semiconductor device of FIGS. 4A and 4B according to one embodiment of the present invention.

FIG. 5 shows a simplified flow chart of a process 500 for assembling the QFN semiconductor device 400 of FIG. 4 according to one embodiment of the present invention. In step 502, lead frame taping is performed on the lead frame 300. In the taping step, an adhesive tape is attached to one side of the lead frame 300. In step 504, an IC die 402 is attached to the die paddle 302 of the lead frame 300 using, for example, an adhesive 410 such as an epoxy or die attach tape, and in step 506, the adhesive 410 is cured, for example, in an oven. The adhesive 410 may be dispensed onto the entire back side of the IC die 402, onto a portion thereof, or onto the connecting bars 308 before the IC die 402 is mounted. As shown, the IC die 402 is mounted such that a portion (e.g., portions 412) of each of the triangular-shaped cavities 306 is left uncovered by the IC die 402.

In step 508, the IC die 402 is electrically connected to (i) the leads 310 with bond wires 404 and to the metal frame 304 of the die paddle 302 with bond wires 406. In this embodiment, the metal frame 304 acts as a ground bar for the IC die 402. Note that, in FIG. 4B, full bond wires 404 are shown for illustrative purposes and do not depict how the bond wires 404 would look in the actual cross-section.

Molding compound 408 is applied in step 510 to encase the top of the lead frame 300, the IC die 402, and the bond wires 404 and 406. Note that, in FIG. 4A, the QFN semiconductor device 400 is shown without molding compound 408 to illustrate the wire bonding process. As shown in FIG. 4B, the molding compound 408 fills the cavities 306 of the lead frame 300. For the cavities 306 located under the IC die 402, the molding compound 408 is permitted to flow into the exposed triangular-shaped portions 412 of the cavities 306 that are not covered by the IC die 402. The lead frame tape (not shown) applied in step 502 prevents the molding compound from encasing the lower surface of the lead frame 300.

The lead frame tape is removed from the lead frame 300 either before or after curing the molding compound, such as in step 512. In step 514, a post-mold cure is performed. Finally, singulation is performed in step 516 to separate the semiconductor device 400 from other semiconductor devices (not shown) assembled at the same time.

When the cavities 306 are filled with molding compound 408, the molding compound 408 becomes trapped (or locked) below the IC die 402 and between the linear connecting bars 308 as shown in FIG. 4B. This entrapment of the molding compound 408 may result in a stronger adhesion between the molding compound 408 and the die paddle 302, when compared to packages that implement the die paddle 102 in FIG. 1 or an X-shaped die paddle as taught in U.S. Pat. No. 5,424,576 ("the '576 patent"). This stronger adhesion may, in turn, lessen the stress at the interface between the molding compound and the lead frame.

Figure 1:
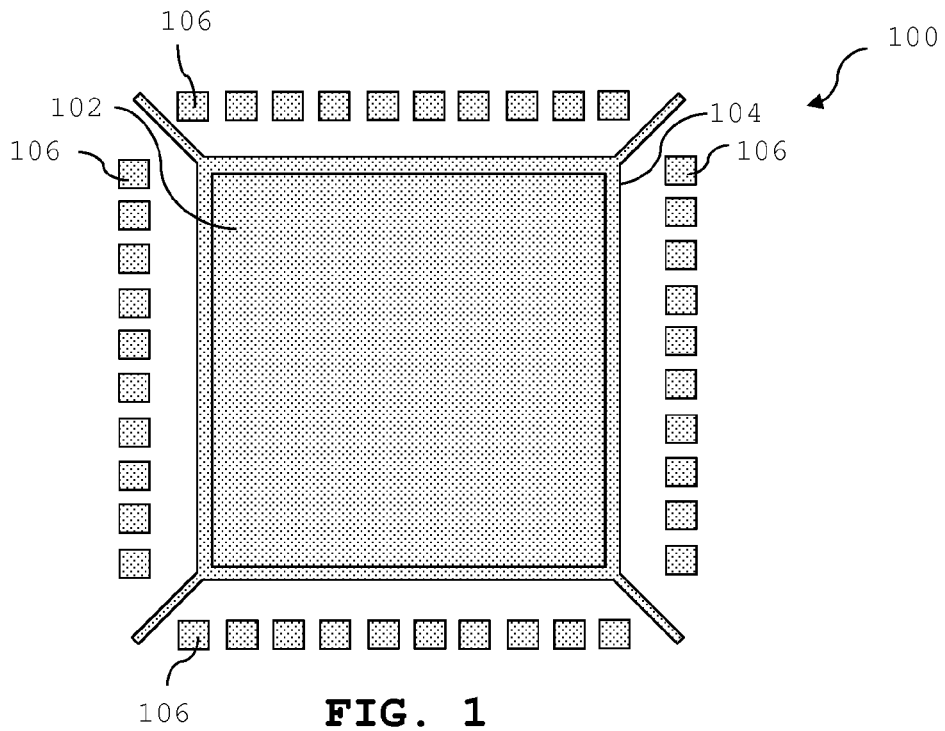
FIG. 1 shows a top view of one implementation of a conventional QFN lead frame.
Figure 2:
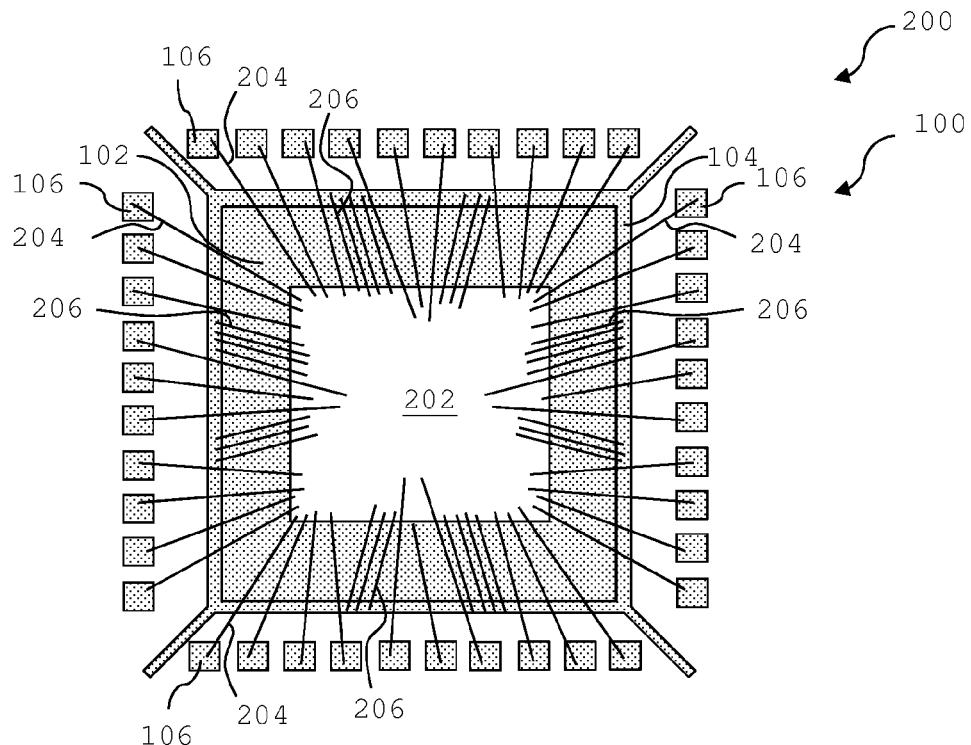
FIG. 2 shows a top view of one implementation of a partially-assembled conventional QFN package.

Compared to the die paddle 102 and the ground bar 104 of the conventional lead frame 102 in FIG. 1, the die paddle 302 has a smaller total surface area to which the molding compound is adhered. As a result, the die paddle 302 has less surface area at which delamination and cracking can occur. Put another way, an overall area of the cavities 306 is greater than an overall area of the connection bars 308.

Compared to the X-shaped die paddle taught in the '576 patent, the die paddle 302 may be less susceptible to shape skew that may cause further stress on the adhesive bond between the molding compound and the die paddle, resulting in delamination. The reason for this is that the triangles formed by the linear connecting bars 308 form a structure that is more rigid and less susceptible to movement than that of the X-shaped die paddle.

Further, compared to the X-shaped die paddle of the '576 patent, the die paddle 302 has a greater surface area for bonding ground wires since the entire metal border 304 may be used for bonding ground wires.

It will be further understood that various changes in the details, materials, and arrangements of the parts which have been described and illustrated in order to explain the nature of this invention may be made by those skilled in the art without departing from the scope of the invention as expressed in the following claims. For example, according to alternative embodiments of the present invention, the number of leads, the number of bond wires, and the connections of bond wires may vary from those show in FIG. 4A.

Figure 6A:
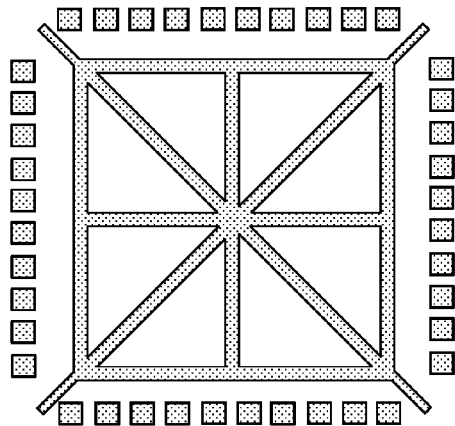
FIGS. 6A-6C show top views of lead frames according to alternative embodiments of the present invention.
Figure 6B:
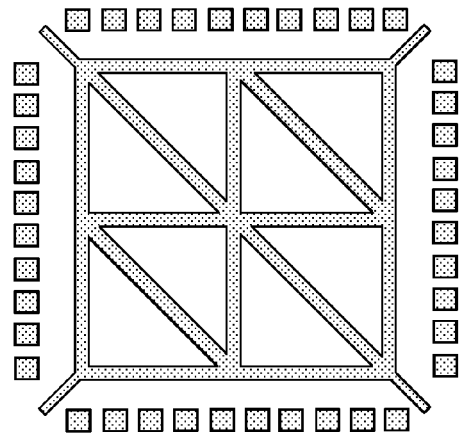

Although an embodiment of the present invention has been described as comprising a die paddle with a rectangular outer shape and eight triangular-shaped cavities formed therein that are arranged in a particular pattern, embodiments of the present invention are not so limited. According to alternative embodiments of the present invention, the eight triangular-shaped cavities may be arranged in a pattern different from that shown in FIG. 3A. For example, FIGS. 6A and 6B show top views of lead frames according to two alternative embodiments of the present invention, where the die paddle of each lead frame has eight triangular-shaped cavities that are arranged in a pattern different from that shown in FIG. 3A.

Figure 6C:
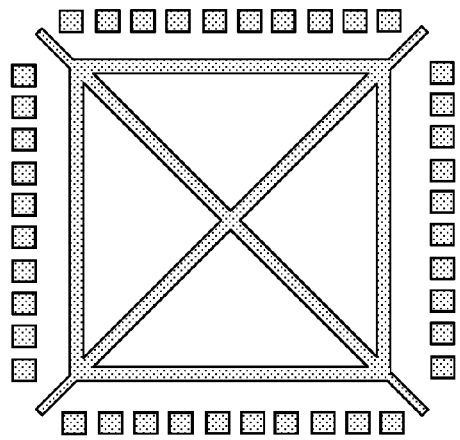

Further, according to alternative embodiments, lead frames of the present invention may comprise die paddles that have more than or fewer than eight triangular-shaped cavities. For example, FIG. 6C shows a top view of a lead frame according to an alternative embodiment of the present invention, wherein the die paddle of the lead frame has four triangular-shaped cavities.

Yet further, according to alternative embodiments, lead frames of the present invention may comprise die paddles that have a shape that is not rectangular. For example, in alternative embodiments of the present invention, the die paddle may have another shape that can be divided into triangles, including (without limitation) a quadrilateral shape such as a rhombus or a trapezoid, or another polygonal shape such as a pentagon or a hexagon.

Although the metal frame 304 in FIG. 3A was described relative to its use as a ground bar, the present invention is not so limited. In alternative embodiments of the present invention, the frame might not be used as a ground bar.

Further, although an embodiment of the present invention was described as having connecting bars 308 of which the thickness is reduced to be less than that of the frame 304 and the metal leads 310, embodiments of the present invention are not so limited. In alternative embodiments of the present invention, the connecting bars may have a thickness that is the same as, or less than, the thickness of one or more of the frame and the leads.

Yet further, although the triangular-shaped cavities 306 in FIG. 3A were described as being formed entirely through the die paddle 302, embodiments of the present invention are not so limited. According to alternative embodiments of the present invention, the triangular-shaped cavities may be formed only part of the way through the top of the die paddle. In such embodiments, the molding compound may or may not fill an area under the IC die.

Even further, although embodiments of the present invention have been described relative to their use with QFN lead frames, embodiments of the present invention are not so limited. In alternative embodiments of the present invention, die paddles as described herein may be implemented in lead frames other than QFN lead frames, including (without limitation) dual-flat no-leads (DFN), quad-flat package (QFP) lead frames, and even lead frames that implement more than one die paddle.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor device, comprising:
a lead frame comprising:
  a die paddle having a metal frame and a plurality of substantially linear metal connecting bars within the metal frame that interconnect different locations of the metal frame to form a plurality of triangles, wherein a triangular-shaped cavity is formed within each triangle; and
  a plurality of metal leads spaced from and surrounding the die paddle;
an integrated circuit (IC) die mounted on the die paddle;
bond wires electrically connecting the IC die to the leads; and
a molding compound encapsulating an upper surface of the lead frame, the bond wires, an upper portion of the die, and filling the triangular-shaped cavities, wherein:
  the IC die is mounted over at least one of the triangular-shaped cavities such that a portion of the at least one triangular-shaped cavity is left uncovered by the IC die; and the molding compound fills volume under the IC die via the uncovered portion of the at least one triangular-shaped cavity.

2. The lead frame of claim 1, wherein a thickness of the connecting bars is less than a thickness of the metal frame.

3. The lead frame of claim 1, wherein the triangular-shaped cavities are formed entirely through the die paddle.

4. The lead frame of claim 1, wherein the lead frame is a quad-flat no-leads type lead frame.

5. The lead frame of claim 1, wherein eight triangle shaped cavities are formed by the connecting bars.

6. The lead frame of claim 1, an area of the connecting bars is less than an area of the cavities.

* * * * *